(12) United States Patent
Hichri et al.

(10) Patent No.: US 7,456,098 B2
(45) Date of Patent: Nov. 25, 2008

(54) BUILDING METAL PILLARS IN A CHIP FOR STRUCTURE SUPPORT

(75) Inventors: Habib Hichri, Wappingers Falls, NY (US); Xiao H. Liu, Croton On Hudson, NY (US); Vincent J. McGahay, Poughkeepsie, NY (US); Conal E. Murray, Yorktown Heights, NY (US); Jawahar P. Nayak, Wappingers Falls, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 11/403,332

(22) Filed: Apr. 13, 2006

(65) Prior Publication Data

US 2006/0190846 A1 Aug. 24, 2006

Related U.S. Application Data

(62) Division of application No. 10/726,140, filed on Dec. 2, 2003, now Pat. No. 7,067,902.

(51) Int. Cl.
*H01L 21/4763* (2006.01)
(52) U.S. Cl. ............... 438/637; 257/621; 257/E21.577; 257/E23.145

(58) Field of Classification Search ............... 438/614, 438/618, 620–640, 652–675; 257/621, 698, 257/774
See application file for complete search history.

(56) References Cited

U.S. PATENT DOCUMENTS

| | | | |
|---|---|---|---|
| 5,788,869 A | 8/1998 | Dalton et al. | |
| 5,798,298 A | 8/1998 | Yang et al. | |
| 6,118,180 A | 9/2000 | Loo et al. | |
| 6,143,396 A | 11/2000 | Saran et al. | |
| 6,211,050 B1 | 4/2001 | Wong | |
| 6,232,662 B1 | 5/2001 | Saran | |
| 6,309,956 B1 | 10/2001 | Chiang et al. | |
| 6,319,818 B1 | 11/2001 | Stamper | |
| 7,060,619 B2 * | 6/2006 | Cowley et al. | 438/687 |
| 2003/0075807 A1 * | 4/2003 | Hsue et al. | 257/774 |

* cited by examiner

*Primary Examiner*—Quoc D Hoang
(74) *Attorney, Agent, or Firm*—Scully, Scott, Murphy & Presser, P.C.; Yuanmin Cai

(57) ABSTRACT

Stacked via pillars, such as metal via pillars, are provided at different and designated locations in IC chips to support the chip structure during processing and any related processing stresses such as thermal and mechanical stresses. These stacked via pillars connect and extend from a base substrate of the strip to a top oxide cap of the chip. The primary purpose of the stacked via pillars is to hold the chip structure together to accommodate any radial deformations and also to relieve any stress, thermal and/or mechanical, build-tip during processing or reliability testing. The stacked via pillars are generally not electrically connected to any active lines or vias, however in some embodiments the stacked via pillars can provide an additional function of providing an electrical connection in the chip.

8 Claims, 5 Drawing Sheets

BUILDING METAL PILLARS IN A CHIP FOR STRUCTURE SUPPORT

RELATED APPLICATIONS

This application is a divisional of U.S. application Ser. No. 10/726,140, filed Dec. 2, 2003 now U.S. Pat. No. 7,067,902.

BACKGROUND OF THE INVENTION

1. Field of the Invention

The present invention relates generally to new semiconductor processes and integrated circuit structures which provide stacked via pillars in multilevel interconnection structures of semiconductor IC (integrated circuit) chips with high conductivity metallurgy such as copper and low-k dielectrics, to provide improved structural support and mechanical stability under large thermal excursions.

The present invention is particularly applicable to silicon microchip technologies where ruptures in metal interconnects due to thermal expansion can be mitigated by structural support provided by electrically non-functional stacked via pillars and fill patterns.

2. Description of the Prior Art

In order to meet the ever increasing demand for increased device density and performance, a semiconductor technology consisting of a low-k dielectric material and an interconnection wiring of copper metallurgy, defined by a dual damascene method, is the present day choice. Because, dry air has the theoretically lowest dielectric constant of one (1), most low-k materials such as aerogels, hydrogen silsesquioxane (HSQ), fluorinated organic polymers (e.g., SiLK, a trade mark of Dow chemical Co., Midland, Mich.), among others, have high porosity and, thereby, a negligibly small mechanical strength.

FIG. 1 is a schematic cross-section of a typical present day high performance interconnection structure. Such schemes generally have semiconductor devices (not shown) formed in silicon substrate 100 and locally interconnected by tungsten or polysilicon interconnection 101 which is imbedded in a passivation layer 103 of boro-phosphosilicate glass (BPSG) deposited just above the silicon substrate 100 to prevent any ionic migration into the device junctions. The high performance interconnection is formed with wirings of high conductivity metallurgies 131, 231, 331 on different levels, embedded in and insulated from each other with layers 112, 212, 312 of low-k dielectric ILD (inter level dielectric), and interconnected at desired points by metal filled via-studs 132, 232, 332. In order to prevent, or to reduce, the corrosive impurity ingression into interconnection wiring structure, as well as to impart mechanical stability, at least one layer of the top most layer of interconnection wiring 431 and via stud 432 is imbedded in one or more layers 412 of previous standard insulators such as silicon oxide, e.g., deposited by the plasma enhanced chemical vapor deposition (PECVD) using silane (SiH$_4$) or tetraethylorthosilicate (TEOS) precursors. Accordingly, the present day high performance interconnection is comprised of one or more layers of high conductivity copper interconnections, imbedded in the low-k dielectric, and bounded on top and bottom by much denser layers of PECVD oxide and BPSG, respectively in the silicon substrate.

In such interconnection structures, a mechanical stress build up during thermal cycle stressing of chips has been observed. This stress build up has resulted in line buckling and liner deformation in stacked vias (LSM, SRAM) that lead to metal void formation and cracking within the interconnect. A reliability evaluation of such integrated circuit structures shown in FIG. 1 revealed excessive and premature failures due to circuit opens caused by the development of cracks in the wiring upon thermal cycling. FIG. 1 shows a typical crack formed in the stacked via-stud, in this example, at the interface of via-stud 332 and interconnection wiring 331, after 1000 thermal cycles between −65° C. and 150° C. Unlike the well known circuit open problem caused by electromigration, these cracks are not current flow dependent and may occur at any location beyond the interface of via-stud 332 and interconnection wiring 331. These cracks are generated upon thermal cycling alone; further, the propensity of crack generation is much greater in stacked via-studs, as shown in FIG. 1. Stacked via-studs are essential in high circuit density interconnections to feed power directly from the bus lines on the upper most wiring level to the local interconnects of semiconductor devices on lower most wiring levels. In an interconnection terminology, the stacked via-studs are comprised of alternatively stacked metal filled via studs 132, 232, and 332 and interconnect metal lines 131, 231, and 331. For the purposes of making stacked via-studs, the cross-sectional area of interconnection line segments 131, 231, 331 are made the same as the cross sectional areas of corresponding via-studs 132, 232, 332. One, or a set of redundant, stacked via-studs provide a direct connection from the top most level to the lower most levels of interconnection. The greater the ratio of stacked via-stud height (H) to diameter of the via-studs (D), the greater is the propensity for crack formation.

The continuing trend of dimensional shrinkage (smaller D) and increased wiring levels (larger H) in multilevel interconnections lead to much higher H to D ratios, thereby making the stacked via-studs of present and future interconnection wiring schemes increasingly more prone to cracks. It should be emphasized that the propensity of crack formation is much less in an interconnection scheme where the low k dielectric material is replaced by the previous standard dense dielectric material (e.g., PECVD oxide).

The crack propensity also increases with the range of temperature cycles and the number of cycles, showing that cracks are generated by metal fatigue, a phenomenon not been seen before in integrated circuit wiring. During thermal cycling of the chip, the stacked via-stud undergoes compressive/tensile stresses generated, respectively, by thermal expansion/contraction of the stacked via-stud due to mismatch in coefficients of thermal expansion between the metal and the surrounding dielectric. Because the stacked via-stud is mechanically pinned by the relatively much denser, and stiffer, layer of PECVD oxide at the top, and by the silicon substrate at the bottom, the difference in thermal expansion/contraction between the metal and the surrounding dielectric causes the stresses in the stacked via-stud. It should be noted that the thermal coefficient of expansion mismatch between copper and a typical low k dielectric material is several times higher than that between copper and PECVD oxide, thereby making the stacked via-stud of copper and low-k dielectric, e.g., SiLK, interconnection wiring scheme much more prone to crack formation than in stacked via-studs of present day multilevel interconnections comprised of a dense dielectric, e.g., PECVD oxide, at all levels of the interconnection. The crack formation in copper-SiLK interconnection wiring schemes is further aggravated due to nearly absent compressive stresses in SiLK dielectric material. Fatigue crack initiation is a surface phenomenon; it is well known that a surface coating improves the fatigue life. Dense oxide films, in deposited thin film form, have high intrinsic compressive stress, thereby exerting a lateral compressive force on via-studs. These compressive forces on the via-stud surface help delay, or prevent, the thermal fatigue failure in present day wiring schemes with a dense dielectric, e.g., PECVD oxide, material. The negligibly small compressive stress in low-k materials, along with the large thermal expansion mismatch between copper and low-k dielectric, e.g., SiLK, are root causes for the observed fatigue failure.

One of the major applications of stacked via-studs is to directly transfer large amounts of current from power buses on the top most level of interconnection wiring to power buses on lower levels in arrangements employing stacked via-studs formed between fat metal lines of power buses on different layers of interconnection wiring. In such cases, the propensity of fatigue crack formation is greatly increased in multilevel interconnection schemes with a low-k dielectric, e.g. SiLK, due to additional compressive stresses arising from the rigidity of fat metal lines acting on the stacked via-stud column.

U.S. Pat. No. 6,309,956 discloses designing chips by using dummy structures formed of an electrically conductive material which is mechanically stronger than the surrounding low-k dielectric material. The dummy structures remain electrically isolated from the conductive metal structures which comprise the electrical devices. The dummy structures are described to be rectangular in shape and positioned approximately parallel to the interconnects. The patent also discusses fabricating more than one level of dummy structures, in which these structures remain electrically and mechanically isolated from the dummy structures of a previous level.

A major distinction of the present invention is the use of stacked via structures extending vertically from the silicon dioxide substrate through all of the low-k dielectric layers to the top capping layer which function primarily to anchor the silicon dioxide substrate to the silicon dioxide capping layer. Another major difference of the present invention involves the placement and density of the stacked vias and fill structures. There is no description in this patent of the required distance between dummy structures, simply that they should be placed in the low-k dielectric layers approximately parallel to the interconnects. The present invention provides a stacked via density to maintain mechanical stability within the interconnects which is highly dependent on the amount of metal fill (including circuitry wiring) within the chip.

The copper areas of fill according to this patent are placed on one or more layers wherever large areas of dielectric exist. Significantly, the Cu fill areas are located in each layer after the wiring for that layer has been designed. In contrast to this patent, the stacked via pillars of the present invention are inserted into the chip design before the chip wiring is laid out and designed, and the wiring is designed around the stacked via pillars. Moreover, the stacked via pillars extend vertically from the substrate oxide all the way up to the top oxide cap.

The prior art has undoubtedly provided solutions and methods for relieving mechanical stress, however the solutions and methods have generally had an adverse impact upon design flexibility that restricts the techniques that circuit designers can use to design chips.

SUMMARY OF THE INVENTION

The present invention provides new semiconductor processes and integrated circuit (IC) structures which incorporate stacked via pillars in multilevel interconnection structures and wiring of semiconductor IC chips with high conductivity metallurgy and low-k dielectric materials, particularly with a high coefficient of thermal expansion and/or air gap bridging, to provide improved structural support and mechanical stability under large thermal excursions. The stacked via pillar structure support is designed for a post CMP (chemical/mechanical polishing) process when the air gaps are formed.

As used herein, low k dielectric materials mean materials such as, but not limited to, organic spin-on materials such as SiLK, JSR, HOSP and the like, carbon doped silicon materials such as CVD dielectric materials (SiCOH), or air gaps. These materials can be porous or non-porous materials.

The stacked via pillars can be efficiently and conveniently formed along with the conventional vias using the same material such as Cu used to form the conventional vias. Alternatively, in slightly more complex processes, the stacked via pillars could be filled with any high modulus and lower coefficient of thermal expansion material such as SiO2, SiN and the like.

The present invention has particular applicability to silicon microchip technologies where ruptures in metal interconnects due to thermal expansion can be mitigated by structural support with electrically non-functional pillars and fill patterns.

The stacked via pillars preferably extend through a chip from the FEOL to the FBEOL (far BEOL) oxide cap with a low-k dielectric cross section, and the design provides space management in the die real estate designed to facilitate stress reduction to protect a chip design lay-out.

The stacked via pillars are normally used in combination with traditional metal fill to provide a stable chip design. The increased via stack density can reduce the metal fill density which advantageously reduces the parasitic capacitance caused by the metal fill.

The stacked via pillars are preferably introduced into the chip design early in the design methodology. Prediction from modeling indicate that a 3 um spacing between stacked via pillars and 50% metal fill stacked via pillars provide a preferred structure. A 50% across chip (fill) of via stacks (within 3 um radius) defines the density ranges when the diameter D of the via studs is 0.2 um and the height H of the via studs is 2.0 um.

Moreover, the stacked via pillars could also function as decoupling capacitor structures within the chip. Decoupling capacitors are known in the prior art, and are usually incorporated into separate chips to provide a charge reservoir to improve the speed of the chip.

A major distinction of the present invention is the use of stacked via structures extending vertically from the silicon dioxide substrate through all of the low-k dielectric layers to the top capping layer, also usually composed of silicon dioxide. These stacked vias may or may not be part of the active circuitry within the chip, but function primarily to anchor the silicon dioxide substrate to the silicon dioxide capping layer. Fill structures, also linked by vias but not necessarily connecting the bottom and top silicon dioxide layers, may be used in addition to the stacked vias towards the goal of providing mechanical support across the entire chip. These fill structures may also be part of the active circuitry.

The present invention provides a stacked via pillar density to maintain mechanical stability within the interconnects which is highly dependent on the total amount of metal (including circuitry interconnect wiring, vias, fill, etc.) within the chip. The stacked vias can be placed in a periodic square array spaced 3 um apart with a metal fill density of 50% within the layers. This orientation of the stacked vias is sufficient to protect all devices built within the region of the stacked vias. Although a greater density of metal fill allows for a greater stacked via spacing, as seen in the modeling results below, the increased parasitic capacitance due to the increased fill makes this option less desirable.

Although the disclosed embodiments are illustrated with respect to Cu conductive metallurgy, the present invention also has broader applicability to other interconnect metallurgies such as silver, gold and aluminum interconnect metallurgies.

Stacked vias provide additional mechanical strength to resist cracking caused by external mechanical loading such as packaging.

BRIEF DESCRIPTION OF THE DRAWINGS

The foregoing objects and advantages of the present invention for building metal pillars in a chip for structure support may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

The present invention provides new semiconductor processes and integrated circuit structures which incorporate stacked via pillars in multilevel interconnection wiring of semiconductor IC (integrated circuit) chips with high conductivity metallurgy such as Cu and low-k inter level dielectrics (ILD), to provide improved structural support and mechanical stability under large thermal excursions.

The present invention provides for the construction of metal stacked via pillars at different locations in IC chips to support the chip structure during processing and any related processing stresses such as thermal and mechanical stresses. These metal stacked via pillars connect in a straight line from the front end of line (FEOL) up to the far back end of line (FBEOL) and the final step of construction, extending from the base substrate to the top oxide cap.

The stacked via pillars are not necessarily electrically connected to any active lines or vias, however in some embodiments of the present invention some of the stacked via pillars can provide an additional function of providing an electrical connection in the chip. The primary purpose of the stacked via pillars is to secure the chip structure together to accommodate any vertical deformations and also to relieve any stress, thermal and/or mechanical, build-up during processing or reliability testing.

The present invention requires a management of the chip space (real estate) to implement the design of the stacked via pillars which are provided to relieve stress and to support the stacked chip structure at any level with minimal stress.

In implementing the solutions of the present invention, a circuit designer can enhance the chip template that includes a guard ring (moisture barrier and crack stop) to accommodate the stacked via pillars. This is a very simple design change that is easily incorporated into most design team methodologies, unlike more restrictive alternatives that hamper the design process. Once the chip template incorporates the stacked via pillars, the circuit designer simply considers those locations as blockages, around which the signal routing tools wire. The amount of real estate that is blocked by the stacked via pillars is insignificant to the routing task, such that it is expected that all routers will be able to complete the signal wiring task without any substantial negative impact.

Figure 1:
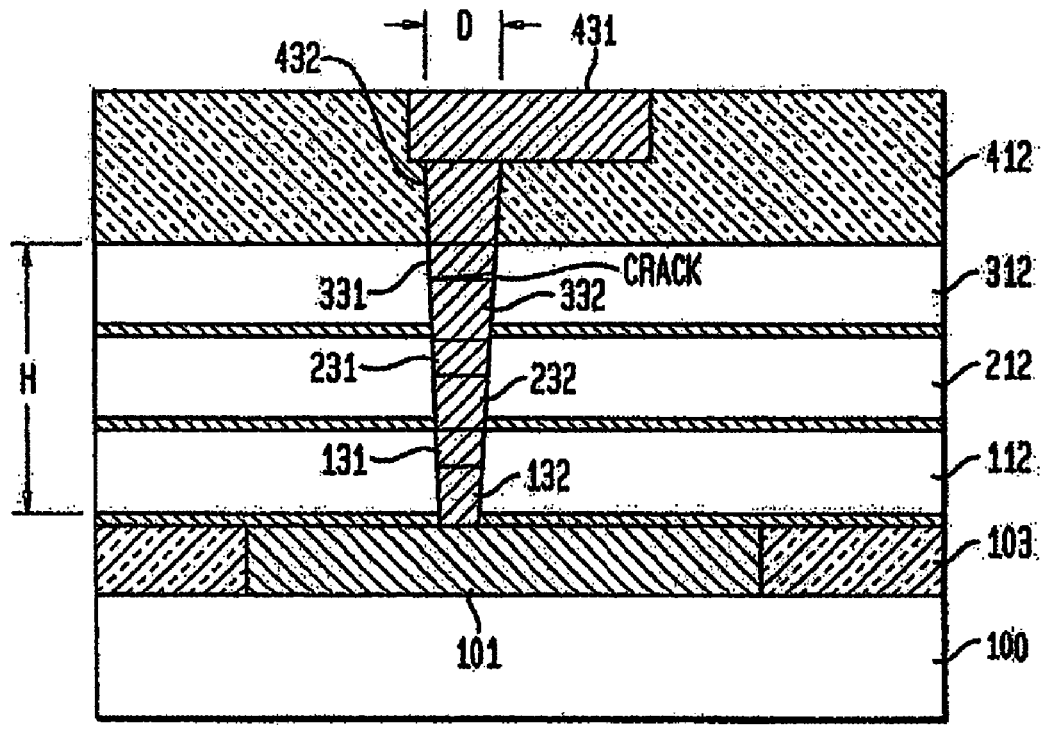
FIG. 1 is a schematic cross sectional view of a typical present day high performance interconnection structure.
Figure 2:
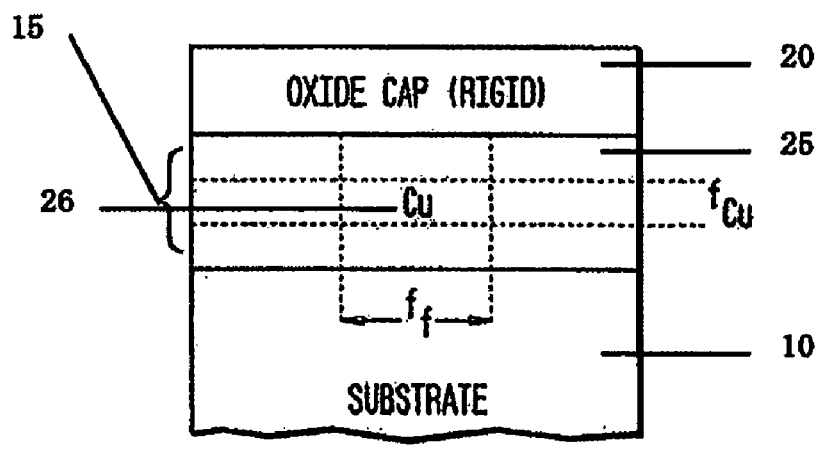
FIG. 2 illustrates a cross sectional view through a model of one level of a typical IC chip having a Cu block, representing the total Cu provided in that one level of the chip for all wiring, vias and interconnects, in a surrounding dielectric material.

FIG. 2 illustrates a cross sectional view through a model of one level of a typical IC chip. A typical IC chip is fabricated on a substrate 10 and can typically comprise 6-11 separate levels 15 capped by a top rigid oxide cap 20, typically of silicon dioxide, or additional level build in dense oxide. In the model of FIG. 2, a Cu block 25 represents the total Cu provided in that level of the chip for all wiring, vias and interconnects in a surrounding dielectric material. The Cu block 25 is represented with a horizontal parameter $f_f$ and a vertical parameter $f_{cu}$. The horizontal parameter $f_f$ represents a fraction of the total amount of Cu to the total amount of material including dielectric material in the horizontal direction in the interconnection structure of that one level, and the vertical parameter $f_{cu}$ represents a fraction of the total amount of Cu fill to the total amount of material including dielectric material such as SiLK in the vertical direction in the interconnection structure of that one level.

Figure 3:
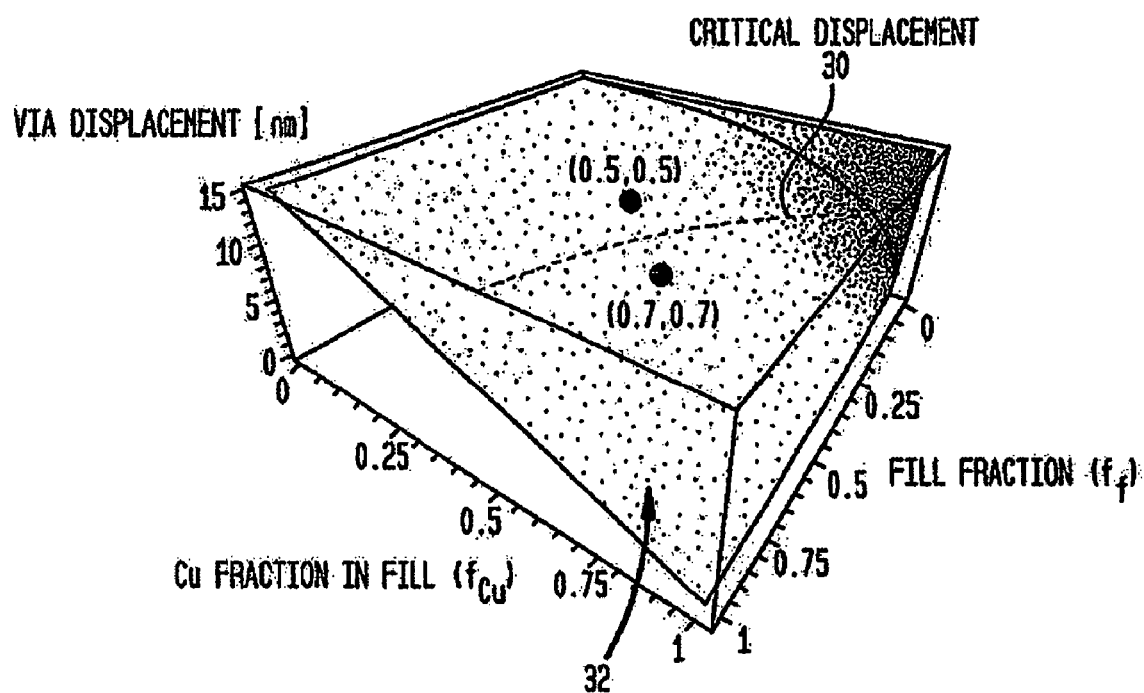
FIG. 3 illustrates, for the model of FIG. 2, a three dimensional curved surface of critical via displacement versus Cu fill for a given change in temperature of the chip.

FIG. 3 illustrates, for the model of FIG. 2, a three dimensional curved surface of critical via displacement in nm, which is proportional to the via strain, versus Cu fill for a change in temperature of the chip of 150 C, starting from a stress free state of the chip, for a chip having a low k dielectric such as SiLK with a vertical thickness (H) of 2 um and an oxide cap vertical thickness of 2 um. The three dimensional graph of FIG. 3 has a first axis of via displacement sue to the presence of the dielectric SiLK from 0 to 15 nm, a second axis of $f_{cu}$, the vertical Cu fraction in fill from 0 to 1.0, and a third axis of $f_f$, the horizontal fill fraction from 0 to 1.0. The three dimensional curved surface represents the critical via displacement (which is proportional to via strain) and shows the via displacement in terms of the percentage of Cu. For instance, the lowermost front corner represents $f_{cu}$=1.0 and $f_f$=1.0, which represents an all Cu interconnection structure in the level, and as expected for an all Cu level, the via displacement is very low approaching 0 nm, while the rearmost corner represents $f_{cu}$=0 and $f_f$=0, which represents an all SiLK interconnection structure in the level, and as expected for an all SILK chip, the via displacement is very high approaching 15 nm. The arrow 30 represents critical displacement on the three dimensional curved surface, and the arrow 32 represents a via displacement, which without additional stacked via pillars, is below a critical value.

Figure 4:
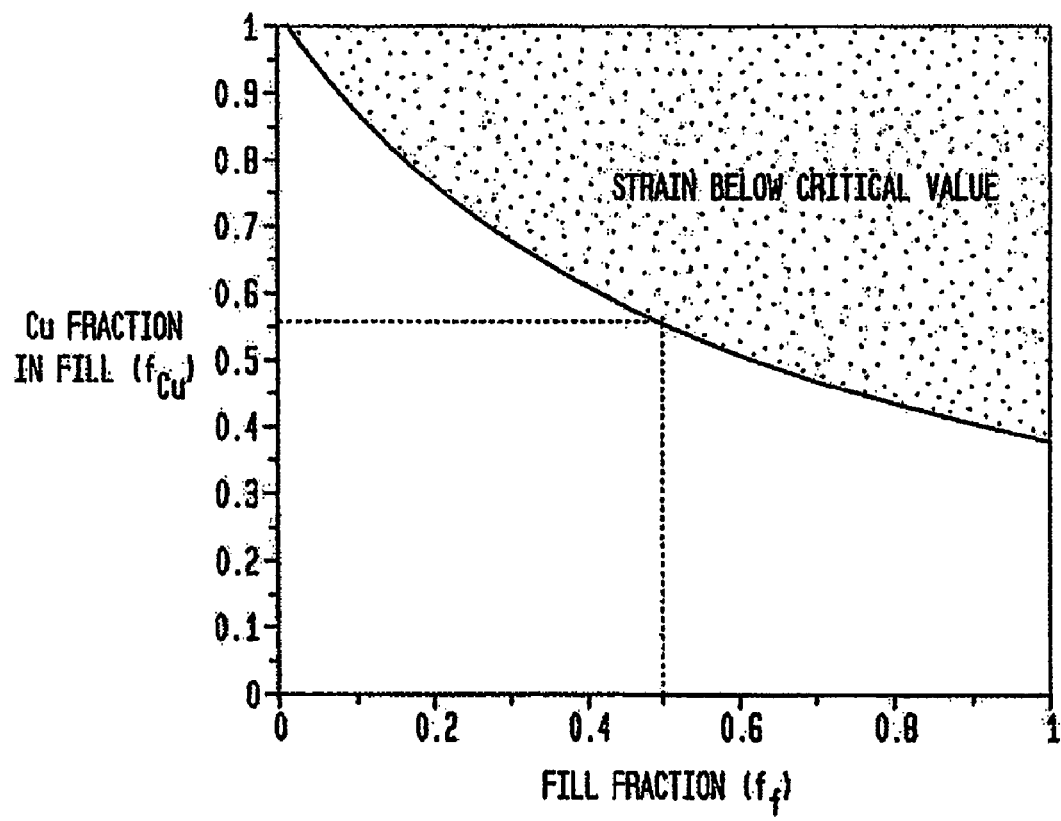
FIG. 4 illustrates, for the model of FIG. 2, a graph of critical via strain versus Cu fill for a given change in temperature of the chip.

FIG. 4 illustrates, for the model of FIG. 2, a graph of critical via strain versus Cu fill for the same parameters as FIG. 3, namely a change in temperature of the chip of 150 C, starting from a stress free state of the chip, for a chip level having a SiLK vertical thickness of 2 um and an oxide vertical thickness of 2 um. The graph of FIG. 4 has a y ordinate axis of $f_{cu}$, the vertical Cu fraction in fill from 0 to 1.0, and an x abscissa axis of $f_f$, the horizontal fill fraction from 0 to 1.0. The graph of FIG. 4 represents one slice through the three dimensional surface of FIG. 3, at a via displacement of 9.7 nm, and values above the graph represent strains below the critical value represented by the graph of FIG. 4 which represent stable designs for a chip, while values below the graph represent strains above the critical value represented by the graph of FIG. 4 which represent unstable designs for a chip. The critical value is derived from mechanical testing data as seen in FIG. 4, for a chip design that has fill fraction of 0.5 and Cu fraction fill ($f_{cu}$) of 0.55. The via displacement will be in the critical via displacement.

Figure 5:
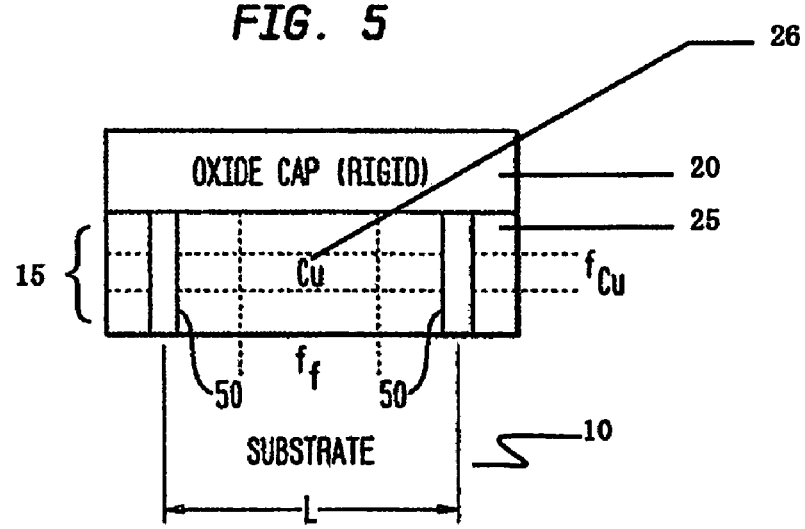
FIG. 5 illustrates a cross sectional view through a model of one level of a typical IC chip as illustrated in FIG. 2 wherein the chip has added stacked via pillars pursuant to the present invention, spaced apart by a distance L, extending through the chip from the base substrate to the top rigid oxide cap.

FIG. 5 illustrates a cross sectional view through a model of one level of a typical IC chip as illustrated in FIG. 2 comprising a base SUBSTRATE 10, a plurality of stacked levels 15 of conductive metallurgy and low-k dielectric material fabricated over the substrate 10, the conductive metallurgy including active electrical lines, with the conductive metallurgy in different levels being connected by conductive metallurgy vias, all represented by the Cu block 26, and being capped by a top OXIDE CAP 20 covering the plurality of stacked levels 15, wherein the same Cu block 26 is represented with the same horizontal parameter $f_f$ and the same vertical parameter $f_{cu}$, and in this instance the chip has added stacked via pillars 50, pursuant to the teachings of the present invention, spaced apart by a distance L, extending through the chip from the base substrate 10 to the top rigid oxide cap 20.

Figure 6:
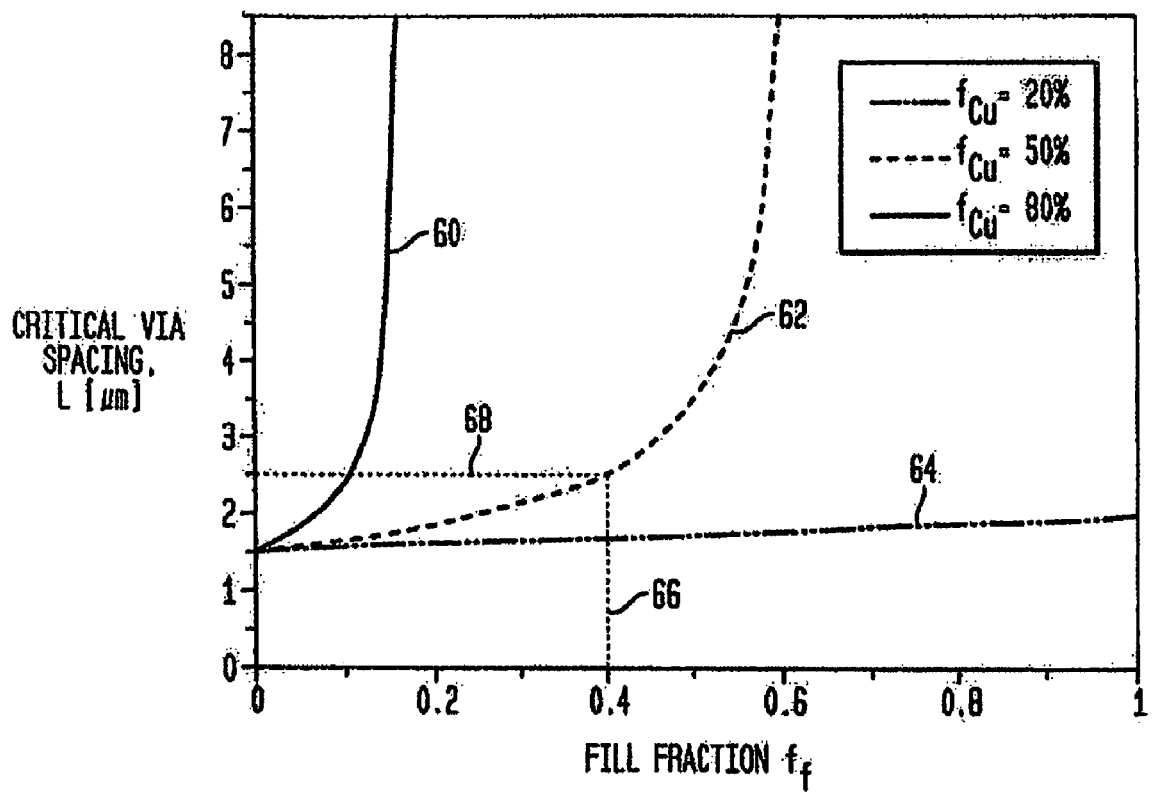
FIG. 6 illustrates, for the model of FIG. 5, several graphs, for different percentages of $f_{cu}$, of critical via spacing versus Cu fill fraction for a given change in temperature of the chip.

FIG. 6 illustrates, for the model of FIG. 5, several graphs, for different percentages of $f_{cu}$, of critical via spacing versus Cu fill fraction, for the same parameters of FIG. 3, namely a change in temperature of the chip of 150 C, starting from a stress free state of the chip, for a chip level having a SiLK vertical thickness of 2 um and an oxide vertical thickness of 2 um. The graph of FIG. 6 has a y ordinate axis of critical via spacing L as shown in FIG. 5 from 0 to 8.5 nm, and an x abscissa axis of $f_f$, the horizontal fill fraction from 0 to 1.0. FIG. 6 illustrates three graphs, a first graph 60 for $f_{cu}$=80%, a second graph 62 for $f_{cu}$=50%, and a third graph 64 for $f_{cu}$=20%, and shows values for the minimum required spacing L between stacked via pillars. For instance, for a chip represented by the second graph 62 for $f_{cu}$=50%, and having a fill fraction $f_f$=0.4, represented by vertical line 66, the graph 62 and horizontal line 68 indicate a minimum via spacing L of 2.5 um required to maintain chip stability.

Figure 7:
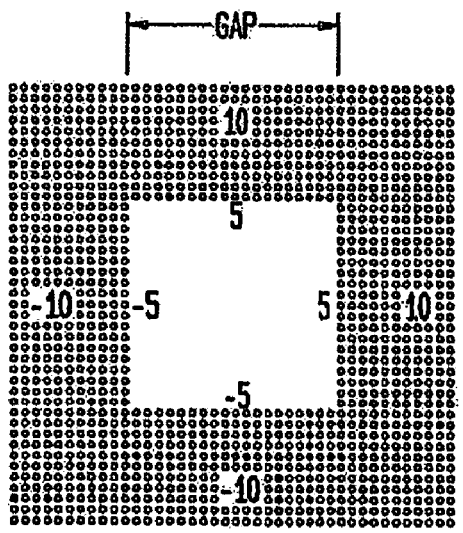
FIG. 7 is a schematic top plan view of a chip having a nested via array, wherein the black dots indicate top plan views of nested vias, with the nested via array having a central gap area which will ordinarily contain some vias but not nested vias.
Figure 8:
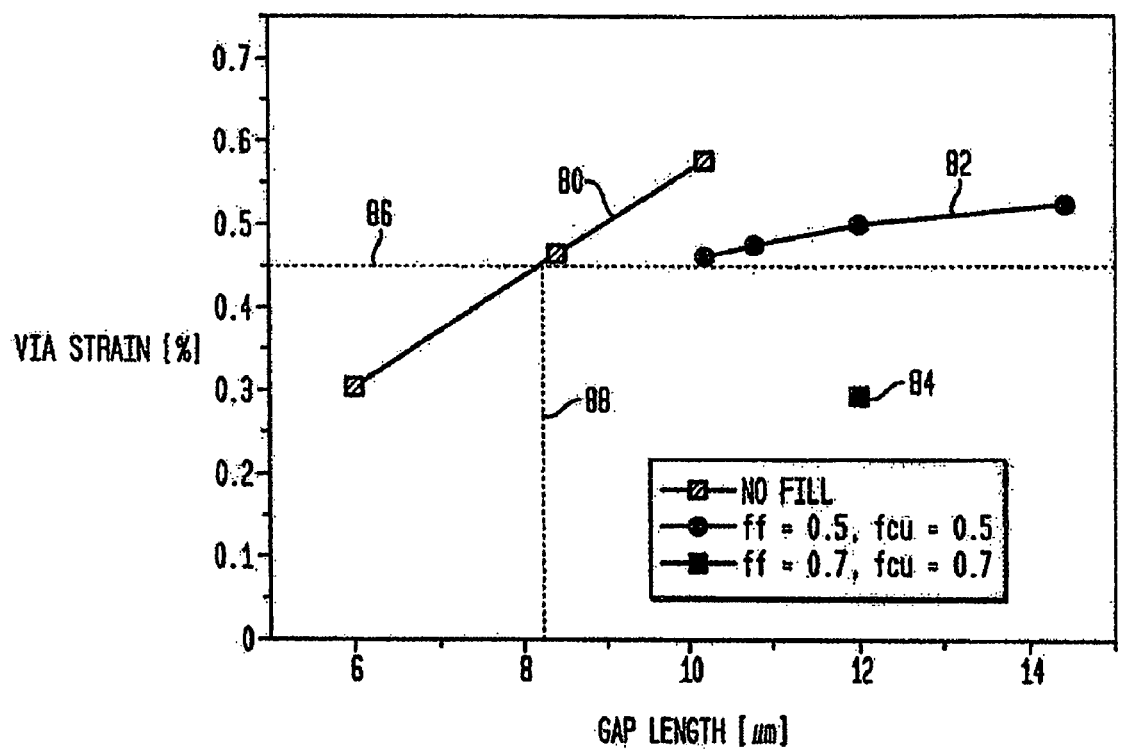
FIG. 8 illustrates, for the model of FIG. 7, several graphs, for different quantities of fill, of strain in the center of the gap versus gap length for a given change in temperature of the chip.

FIGS. 7 and 8 represent supplemental secondary aspects of the present invention. FIG. 7 is a schematic top plan view of a chip having a nested via array, wherein the black dots indicate top plan views of nested vias, with the nested via array having a central approximately square shaped area with a side dimension indicated by "gap". The gap will ordinarily contain some ordinary vias as required by the circuits therein but not the nested vias as shown in FIG. 7.

FIG. 8 illustrates, for the model of FIG. 7, several graphs of strain in the center of the gap versus gap length, for the same parameters of FIG. 3, namely a change in temperature of the chip of 150 C, starting from a stress free state of the chip, for a chip level having a SiLK vertical thickness of 2 um and an oxide vertical thickness of 2 um. Additionally, for the model of FIG. 7, the graphs are for a via width of 0.2 um and a via center to center spacing of 0.6 um. It should be realized that different via widths and via spacings would be represented by other graphs. The graph of FIG. 8 has a y ordinate axis of via strain (strain is the change in length or displacement over the original length) as a fraction from 0 to 0.75%, and an x abscissa axis of gap length from 5.0 to 15.0 um. FIG. 8 illustrates three graphs, a first graph 80 for a chip with no fill (no Cu which is a worst case (and unrealistic) situation as Cu mitigates thermal expansion), a second graph 82 for a chip with $f_f$=0.5 and $f_{cu}$=0.5, and a third graph or point value 84 for $f_f$=0.7 and $f_{cu}$=0.7. FIG. 8 also has a horizontal line 86 which represents the critical threshold level of a stable chip design. For instance, for a chip represented by the first graph 80 for no Cu fill, as indicated by the graph 80 and lines 86 and 88, a gap length of <8.1 um is required for a stable chip design to protect vias inside the gap. Moreover, as indicated by the graphs 80, 82 and 84, as the Cu fill increases, the critical gap length increases.

The design methodology of the present invention can proceed with the following general approaches. The design methodology could select a given spacing for the stacked via pillars, and then design the chip around that given spacing, which is a preferred embodiment. The circuit designer can enhance the chip template to accommodate the stacked via pillars which is a very simple design change that is easily incorporated into most design team methodologies, unlike more restrictive alternatives that hamper the design process. Once the chip template incorporates the stacked via pillars, the circuit designers simply consider those locations as blockages, around which the signal routing tools wire. The amount of real estate that is blocked by the stacked via pillars is insignificant to the routing task, such that it is expected that all routers will be able to complete the signal wiring task without any substantial negative impact. Alternatively, the design methodology could design a chip and then determine $f_f$ and $f_{cu}$ for the designed chip, which would then be used to determine a minimum spacing for the stacked via pillars.

Figure 9:
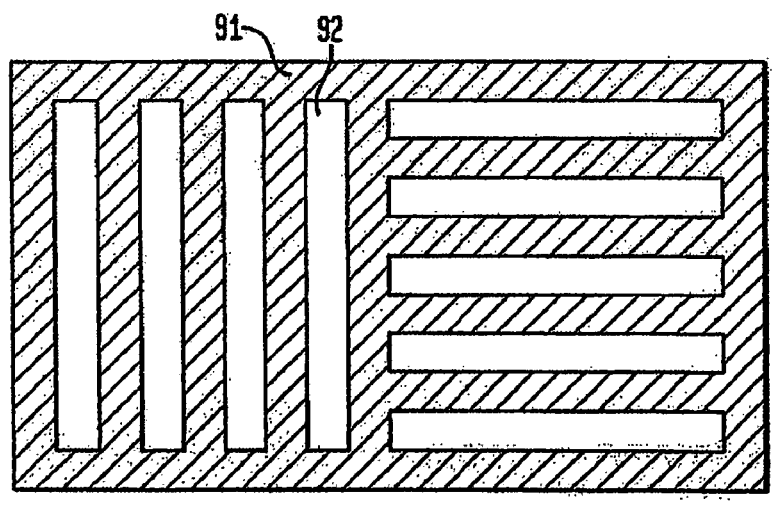
FIG. 9 is a schematic top plan view of a chip design, wherein the shaded region indicates sections of nested vias and the unshaded regions indicate gaps for interconnection wiring.

FIG. 9 illustrates an alternate embodiment of the design methodology in which the stacked via pillars are nested throughout a region of the chip design 91 that create several regions of gaps 92 that are well protected by stacked via pillars. The gaps represent sections of chip real estate in the BEOL that are free from blockages so that chip designers may route interconnect wiring in the traditional manner without the need to modify the chip design on a local scale. The number and positioning of the gaps is not limited to the arrangement depicted in FIG. 9 so that those skilled in the art can create many alternative gap designs and layouts based on the present invention.

While several embodiments and variations of the present invention for building metal pillars in a chip for structure support are described in detail herein, it should be apparent that the disclosure and teachings of the present invention will suggest many alternative designs to those skilled in the art.

Having thus described our invention, what we claim as new and desire to secure by Letters Patent is:

1. A method of designing an integrated circuit (IC) chip comprising:
    designing the chip with a base substrate, a plurality of stacked layers of conductive metallurgy and low-k dielectric material fabricated over the substrate, with the conductive metallurgy including active electrical lines, and the conductive metallurgy in different layers being connected by conductive metallurgy vias, and being capped by a top oxide cap;

incorporating in the design of the chip a plurality of stacked via pillars positioned at spaced locations in the chip, wherein the plurality of stacked via pillars extend completely from the base substrate of the chip to the top oxide cap of the chip, and at least a portion of the plurality of stacked via pillars are not electrically connected to any of the active electrical lines or vias, wherein the plurality of stacked via pillars support the chip structure to accommodate radial deformations during any thermal and/or mechanical stresses, and said stacked via pillars are fabricated of a high modulus, low coefficient of thermal expansion material selected from $SiO_2$ and SiN, which is different from the conductive material forming the conductive metallurgy vias in the chip.

2. The method of claim 1, including designing at least some of the stacked via pillars to electrically connect to the active electrical lines or vias to provide an additional function of providing an electrical connection in an interconnection structure of the chip.

3. The method of claim 1, including designing the spacing between adjacent stacked via pillars by determining the total amount of conductive metallurgy in an interconnection structure of the chip.

4. The method of claim 1, including designing the spacing between adjacent stacked via pillars by determining the total amount of conductive metallurgy in an interconnection structure of the chip and determining a horizontal parameter representing a fraction of the total amount of metallurgy fill to the total amount of material including dielectric material in the horizontal direction in the interconnection structure of the chip, and determining a vertical parameter representing a fraction of the total amount of metallurgy fill to the total amount of material including dielectric material in the vertical direction in the interconnection structure of the chip.

5. The method of claim 1, including designing the plurality of stacked via pillars to be positioned in a regular nested array on the chip, and determining the spacing between adjacent stacked via pillars by the total amount of conductive metallurgy in an interconnection structure of the chip.

6. The method of claim 1, including designing the plurality of stacked via pillars to be positioned in a regular nested array on the chip, and determining the spacing between adjacent stacked via pillars by the total amount of conductive metallurgy in an interconnection structure of the chip, determining a horizontal parameter representing a fraction of the total amount of metallurgy to the total amount of material including dielectric material in the horizontal direction in the interconnection structure of the chip, and determining a vertical parameter representing a fraction of the total amount of metallurgy to the total amount of material including dielectric material in the vertical direction in the interconnection structure of the chip.

7. The method of claim 1, including incorporating the design of the plurality of stacked via pillars in a chip template, and routing the active electrical lines and vias around the plurality of stacked via pillars.

8. The method of claim 1, including first designing and laying out the design of the chip in an interim design, and then determining the fraction of total metallurgy to total material in an interconnection structure of the interim design of the chip, and then using the determined fraction to determine a minimum spacing for the stacked via pillars.

* * * * *